United States Patent
Abughazaleh et al.

(10) Patent No.: US 7,619,298 B1
(45) Date of Patent: Nov. 17, 2009

(54) METHOD AND APPARATUS FOR REDUCING PARASITIC CAPACITANCE

(75) Inventors: Firas N. Abughazaleh, Austin, TX (US); Brian T. Brunn, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 283 days.

(21) Appl. No.: 11/095,812

(22) Filed: Mar. 31, 2005

(51) Int. Cl.
*H01L 27/108* (2006.01)

(52) U.S. Cl. .................... 257/532; 257/516; 257/535; 257/306; 257/E27.034

(58) Field of Classification Search ................ 257/516, 257/532, 535, 306, E27.034
See application file for complete search history.

(56) References Cited

U.S. PATENT DOCUMENTS 5,059,548 A * 10/1991 Kim ........................... 438/396
5,162,248 A * 11/1992 Dennison et al. ............. 438/396
6,252,293 B1 * 6/2001 Seyyedy et al. .............. 257/530
6,288,604 B1 * 9/2001 Shih et al. ....................... 330/9
6,933,551 B1 * 8/2005 Stribley et al. .............. 257/296
7,130,182 B2 * 10/2006 Balster et al. ............. 361/321.1

OTHER PUBLICATIONS

U.S. Appl. No. 10/839,932, filed May 5, 2004, Abughazaleh.

* cited by examiner

*Primary Examiner*—Eugene Lee
(74) *Attorney, Agent, or Firm*—LeRoy D. Maunu; Michael R. Hardaway; Lois D. Cartier

(57) ABSTRACT

A method and apparatus for reducing parasitic capacitance. A P-well blocked layer is formed directly beneath a parasitic device. The P-well blocked layer significantly increases the resistance underneath the parasitic device. The resistance of the P-well blocked layer, in effect, partially disconnects the parasitic device from the ground terminal to minimize the effective capacitive impedance that is added to the total termination impedance.

14 Claims, 12 Drawing Sheets

METHOD AND APPARATUS FOR REDUCING PARASITIC CAPACITANCE

FIELD OF THE INVENTION

This invention relates in general to integrated circuits, and more particularly to method and apparatus for reducing parasitic capacitance.

BACKGROUND

The transmission of multi-gigabit data rates in wired broadband communication systems pose a big challenge to system design. Part of the challenge lies in the design of the communication channel and interfacing to it. Typical issues that need to be dealt with are channel impedance matching and channel losses of the high frequency components of the signal due to channel parasitic impedances manifested in inductive, capacitive and skin loss among other effects.

Of a particular interest is matching of impedance between the data channel and the receiving end. In an ideal scenario, a termination resistance is placed on chip at the front end of the receiver with a resistance value that matches the channel impedance. Matching of impedance at the channel/receiver interface helps reduce the reflected signal energy back to the transmitter thus reducing noise and timing jitter of the signal and improving the return loss (RL).

Typically in a data channel, a terminated signal is AC coupled through a relatively large capacitance to an input buffer to condition the signal for further processing. Ideally, the AC coupling capacitance does not affect the termination impedance because it connects to an (ideally) infinite impedance buffer. In reality, however, there are parasitic capacitances that are on-chip, e.g., the terminal and Electrostatic Discharge (ESD) capacitance on one end of the AC coupling capacitor and the input buffer gate capacitance and AC coupling capacitance to ground that alter the termination impedance magnitude and phase.

These parasitic capacitances causes the high frequency components of the received digital signal to have a larger reflection magnitude thus worsening the return loss (RL). The parasitic capacitances must be reduced as much as possible while minimizing any change to the termination impedance to minimize the reflection and improve the RL figure.

It can be seen that there is a need for a method and apparatus for reducing parasitic capacitance.

SUMMARY

To overcome the limitations in the prior art described above, and to overcome other limitations that will become apparent upon reading and understanding the present specification, the present invention discloses a method and apparatus for reducing parasitic capacitance, which in an exemplary embodiment provides for on-chip reduction of return loss.

An embodiment of the present invention solves the above-described problems by providing a P-well blocked layer directly beneath a parasitic device. The P-well blocked layer significantly increases the resistance underneath the parasitic device. The resistance of the P-well blocked layer, in effect, partially disconnects the parasitic device from the ground terminal to minimize the effective capacitive impedance that is added to the total termination impedance.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

An embodiment of the present invention provides a method and apparatus for on-chip reduction of return loss. A P-well blocked layer is provided directly beneath a parasitic device. The P-well blocked layer significantly increases the resistance underneath the parasitic device. The resistance of the P-well blocked layer, in effect, partially disconnects the parasitic device from the ground terminal to minimize the effective capacitive impedance that is added to the total termination impedance.

Figure 1:
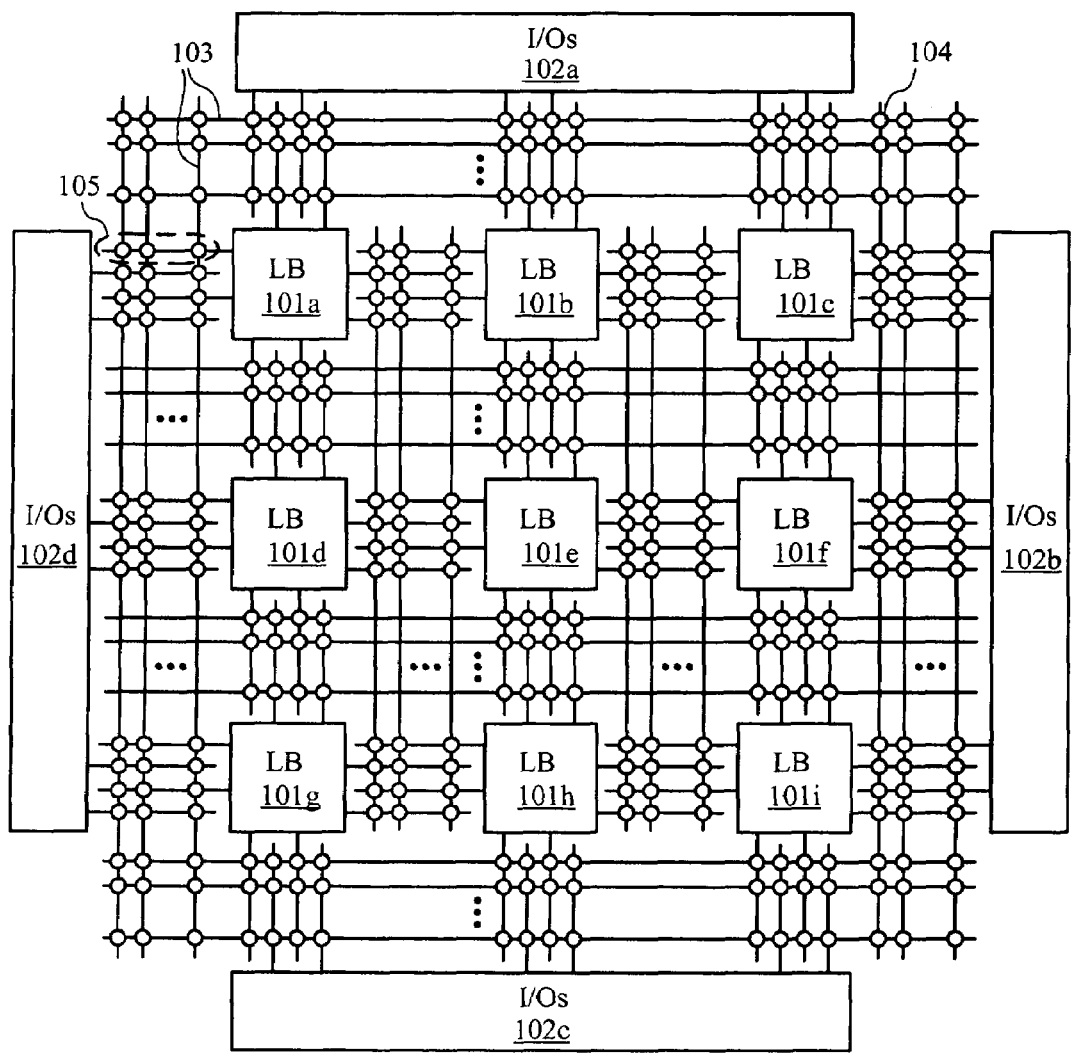
FIG. 1 is a simplified illustration of an example of a FPGA.

FIG. 1 is a simplified illustration of an example of a FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

Figure 2:
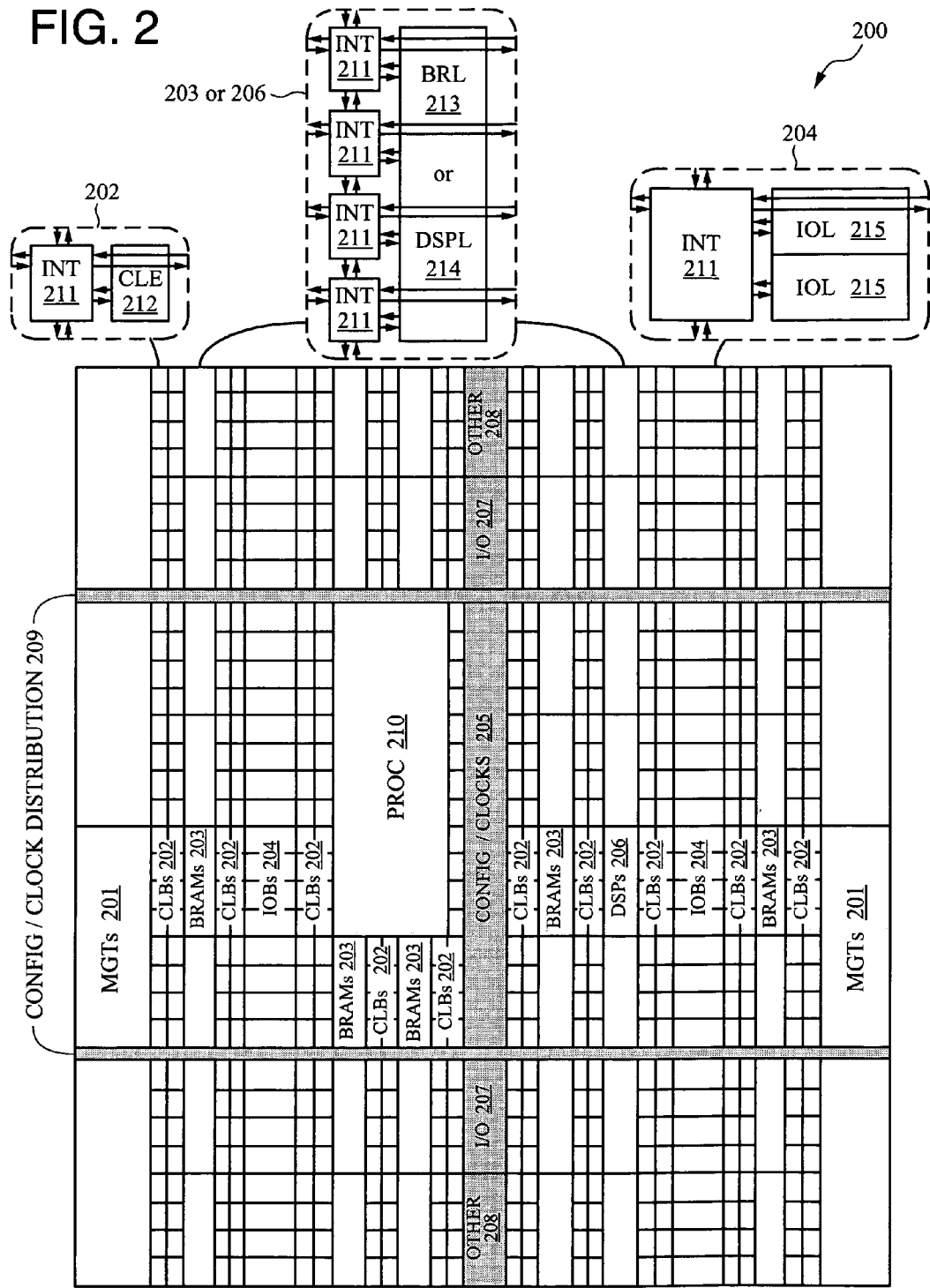
FIG. 2 illustrates an FPGA architecture 200 according to an embodiment of the present invention.

FIG. 2 illustrates an FPGA architecture 200 according to an embodiment of the present invention. As noted above, advanced FPGAs can include several different types of programmable logic blocks in the array. For example, in FIG. 2, the FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Configuration logic 205 allows configuration data values to be loaded into the FPGA architecture 200. In accordance with an embodiment of the present invention, the configuration data takes into consideration the actual location of a circuit in the package, which can result in increased circuit performance. Placement based information is provided to the FPGA architecture 200 that will optimize its performance.

Note that FIG. 2 is intended to illustrate only one example of an FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
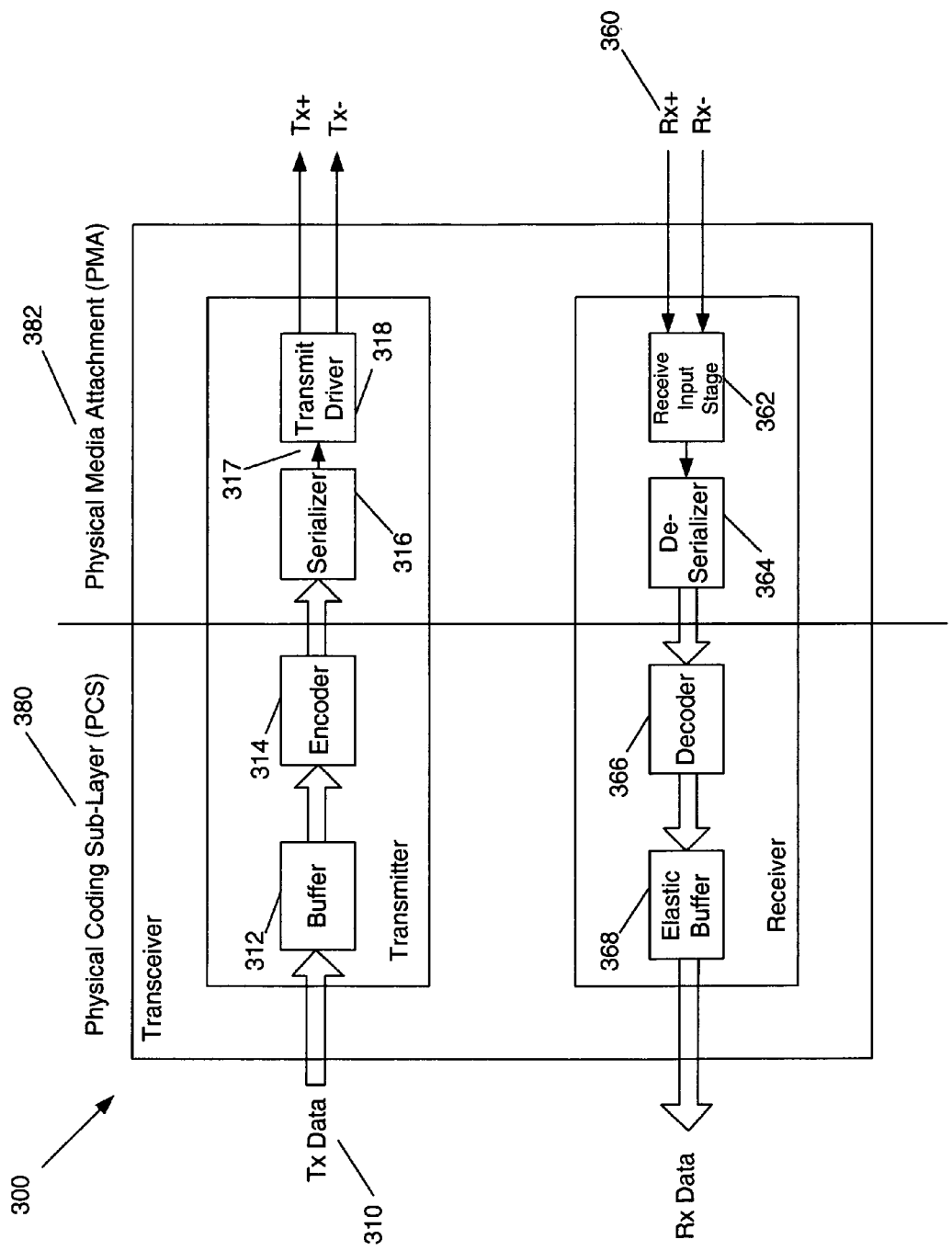
FIG. 3 is a block diagram of a transceiver using a transmit and receive data buffer according to one embodiment of the present invention.

FIG. 3 is a block diagram 300 of a transceiver using a transmit and receive data buffer according to one embodiment of the present invention. In FIG. 3, parallel data 310 is received in a buffer 312, such as a FIFO buffer. The data is encoded by an encoder 314 according to a desired coding scheme. The data is then serialized 316. The serialized data 317 is provided to a transmit driver 318 for transmission according to a transmit clock 320. On the receiver side, serial data 360 is received at a receive input stage 362 and clocked according to receive clock 370. The data is deserialized 364 and then decoded by a decoder 366. The decoded parallel data is provided to elastic buffer 368. A transceiver requires the use of integrated transmit 312 and receive 368 buffers to handle the phase difference between the PCS and PMA clock domains. In FIG. 3, the PCS portion 380 is on the left and the PMA portion 382 is on the right.

Figure 4:
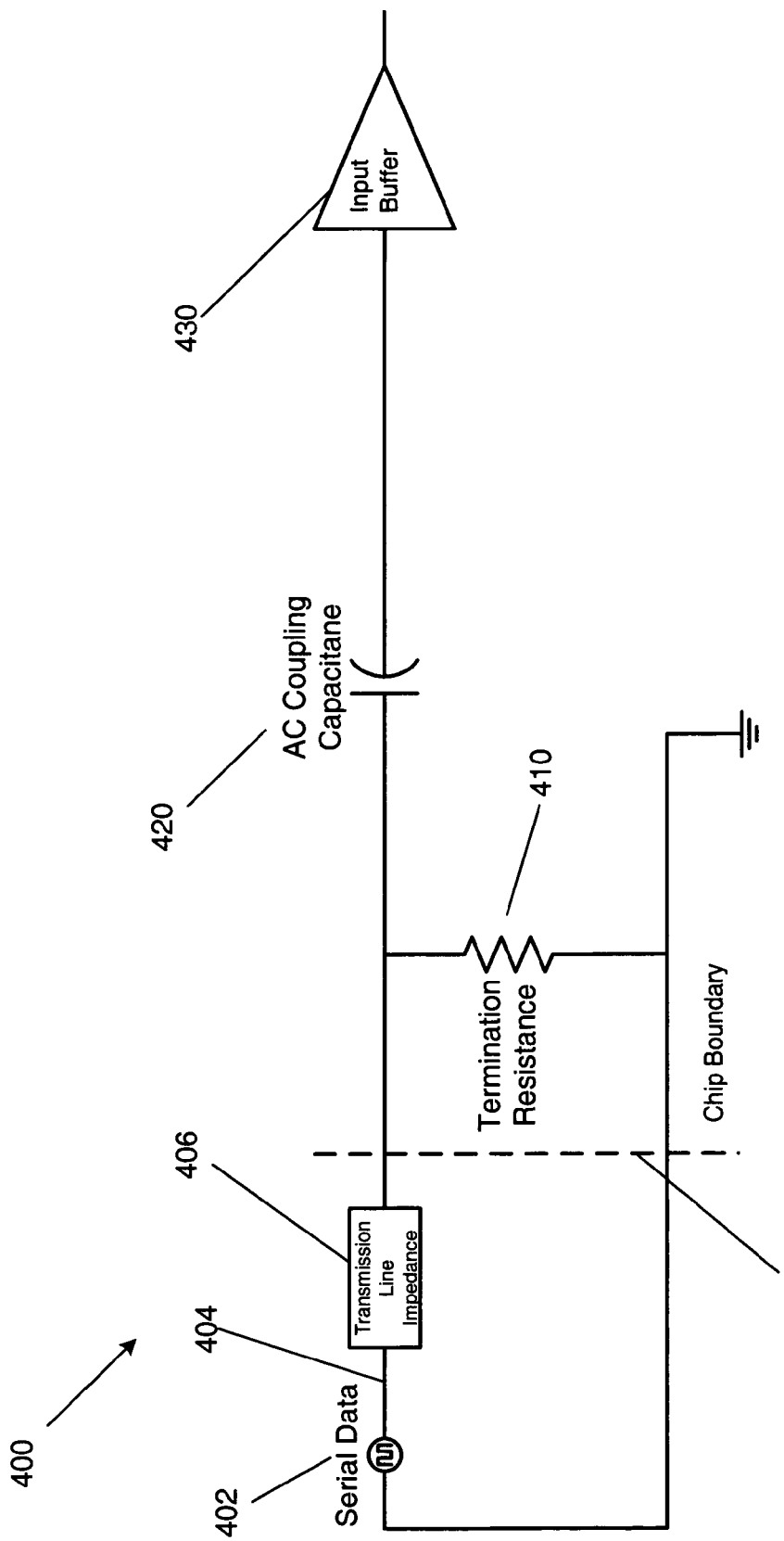
FIG. 4 illustrates an ideal input channel model having zero return loss.

FIG. 4 illustrates an ideal input channel model 400 having zero return loss. Serial data 402 is transmitted over a transmission line 404 having a transmission line impedance 406. In an ideal scenario, a termination resistance 410 is placed on chip at the front end of the receiver interface 412 with a resistance value that matches the channel impedance. Matching of impedance at the channel/receiver interface 412 helps reduce the reflected signal energy back to the transmitter thus reducing noise and timing jitter of the signal and improving the return loss (RL).

In FIG. 4, the terminated signal is AC coupled through a relatively large capacitance 420 to an input buffer 430 to condition the signal for further processing. Ideally, the AC coupling capacitance 420 does not affect the termination impedance because it connects to an (ideally) infinite impedance buffer 430.

Figure 5:
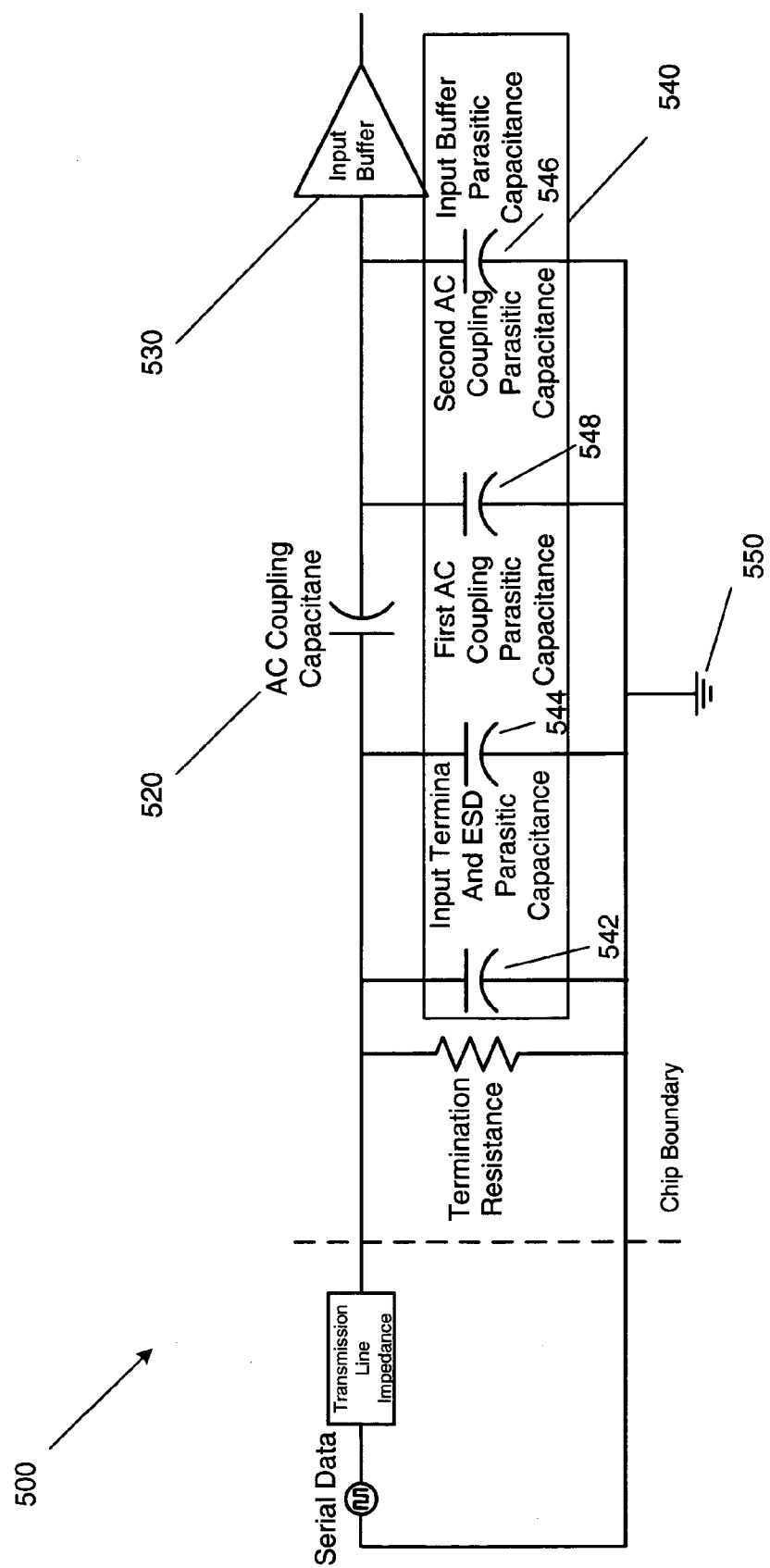
FIG. 5 illustrates a model of an actual input channel including component parasitic capacitances.

FIG. 5 illustrates a model of an actual input channel 500 including component parasitic capacitances 540. Parasitic capacitances 540 include the terminal capacitance and ESD parasitic capacitance 542 and first AC parasitic coupling capacitance 544 on one end of the AC coupling capacitor 520 and the input buffer gate capacitance 546 and the second AC coupling capacitance 548 to ground 550 that alter the termination impedance magnitude and phase to the input buffer 530. These parasitic capacitances causes the high frequency components of the received digital signal to have a larger reflection magnitude thus worsening the return loss (RL). Accordingly, in order to minimize the reflection and improve the RL figure, the parasitic capacitances 540 should be reduced as much as possible in order to minimize its effects on the termination impedance.

Figure 6:
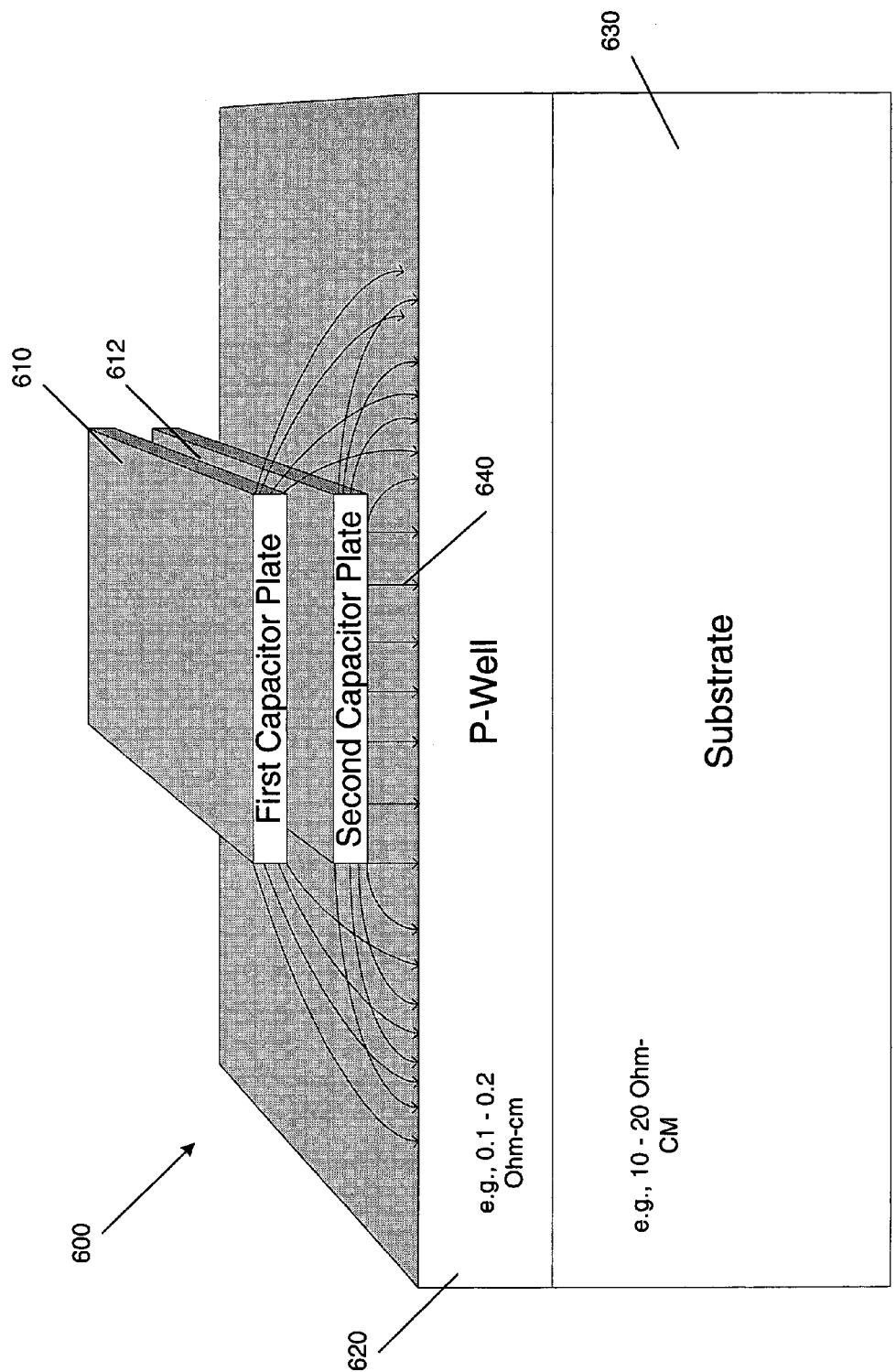
FIG. 6 illustrates a metal capacitor formed over a P-well substrate.

FIG. 6 illustrates a metal capacitor 600 formed over a P-well substrate. In FIG. 6, a first capacitor plate 610, a second capacitor plate 612, P-well 620 and substrate layer 630 are shown. Those skilled in the art will recognize that the present invention is not limited exclusively to a capacitor. Moreover, those skilled in the art will recognize that the present invention, when implemented with a capacitor for reducing return loss, is not meant to be limited to any particular capacitor configuration, i.e., the capacitor may take the form of a finger capacitor, a parallel plate capacitor, etc.

Nevertheless, in the case of a capacitor, the size of the AC coupling capacitance and the linearity system requirements necessitates the use of metal-to-metal capacitance, which, for the size used, requires a significantly large layout area. Such area creates a significant size of second plate 612 to ground (P-Well 620/substrate 630) parasitic capacitance 640 which contributes a sizable percentage of the total parasitic capacitances of the input interface.

Figure 7:
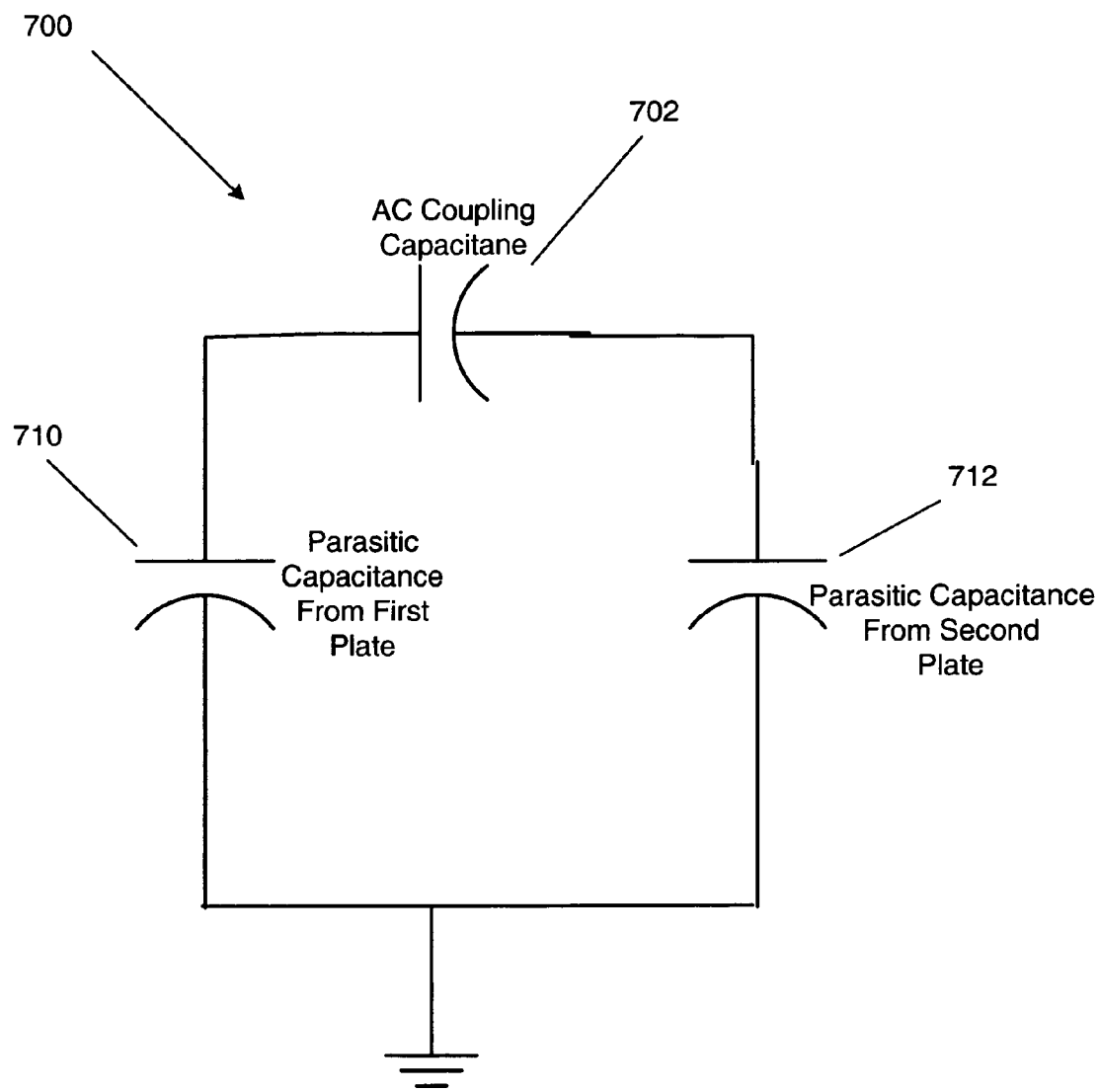
FIG. 7 is a circuit diagram of the metal capacitor over the p-well of FIG. 6.

FIG. 7 is a circuit diagram 700 of the metal capacitor 702 over the P-well of FIG. 6. As can be seen in FIG. 7, the circuit 700 includes the parasitic capacitance of the first plate 710 and the bottom plate 712.

Figure 8:
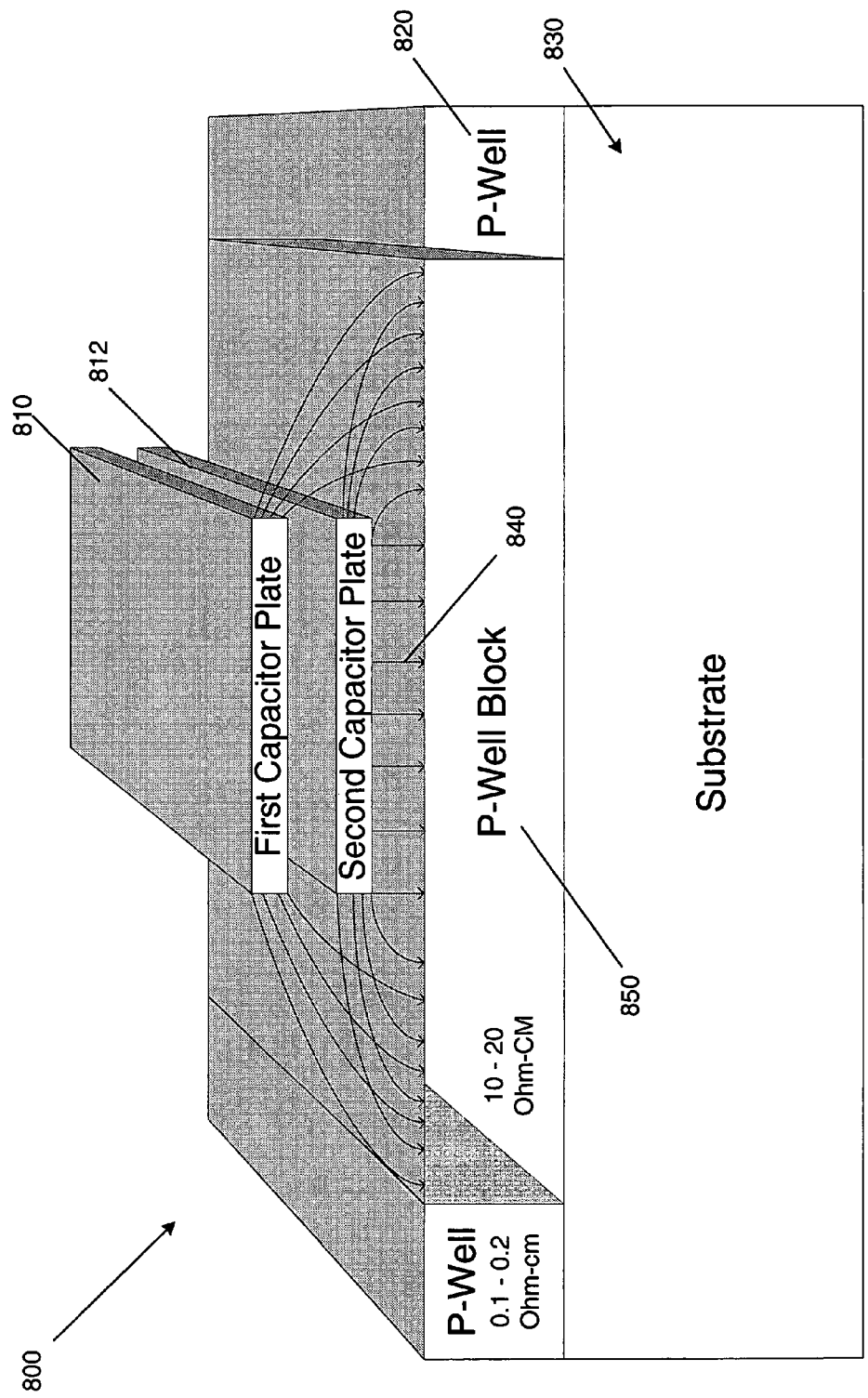
FIG. 8 illustrates a metal capacitor formed over a P-well blocked substrate according to an embodiment of the present invention.

FIG. 8 illustrates a metal capacitor formed over a P-well blocked substrate according to an embodiment of the present invention. As can be seen in FIG. 8, a first capacitor plate 810 and a second capacitor plate 812 are formed over a P-well blocked layer 850, which is disposed between the P-well regions 820. As noted earlier, the capacitor may take any form including a finger capacitor or a parallel plate capacitor. The layers of the capacitor 810, 812 are formed over the substrate layer 830. To reduce the "effect" of such parasitic capacitance, the P-Well Blocking (PWB) layer 850 is utilized to significantly increase the resistance underneath the second plate 812, e.g., as much as ten times that of the normal P-Well resistance to ground. The resistance of the P-well blocked layer 850, in effect, partially disconnects the parasitic capacitance 840 of the first plate 810 and second plate 812 capacitor plates from the ground terminal to minimize the effective capacitive impedance that is added to the total termination impedance.

Figure 9:
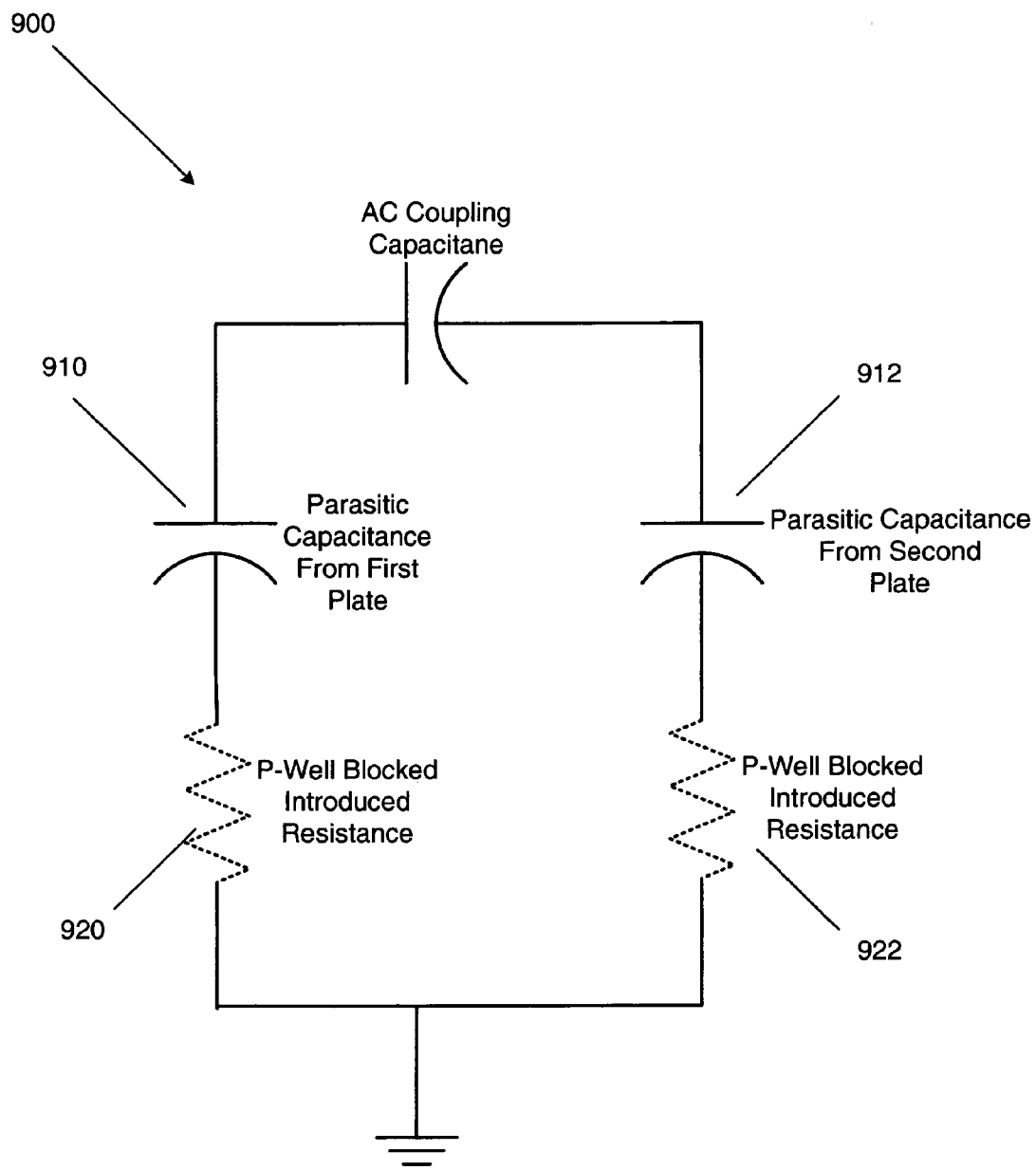
FIG. 9 is a circuit diagram of the metal capacitor over the P-well blocked substrate of FIG. 8 according to an embodiment of the present invention.

FIG. 9 is a circuit diagram 900 of the metal capacitor over the P-well blocked substrate of FIG. 8 according to an embodiment of the present invention. As can be seen in FIG. 9, the circuit includes the parasitic capacitance of the first plate 910 and the second plate 912. However, P-well blocked introduced resistances 920, 922 are also added to partially disconnect the capacitance of plates 910, 912 from the ground terminal.

Figure 10:
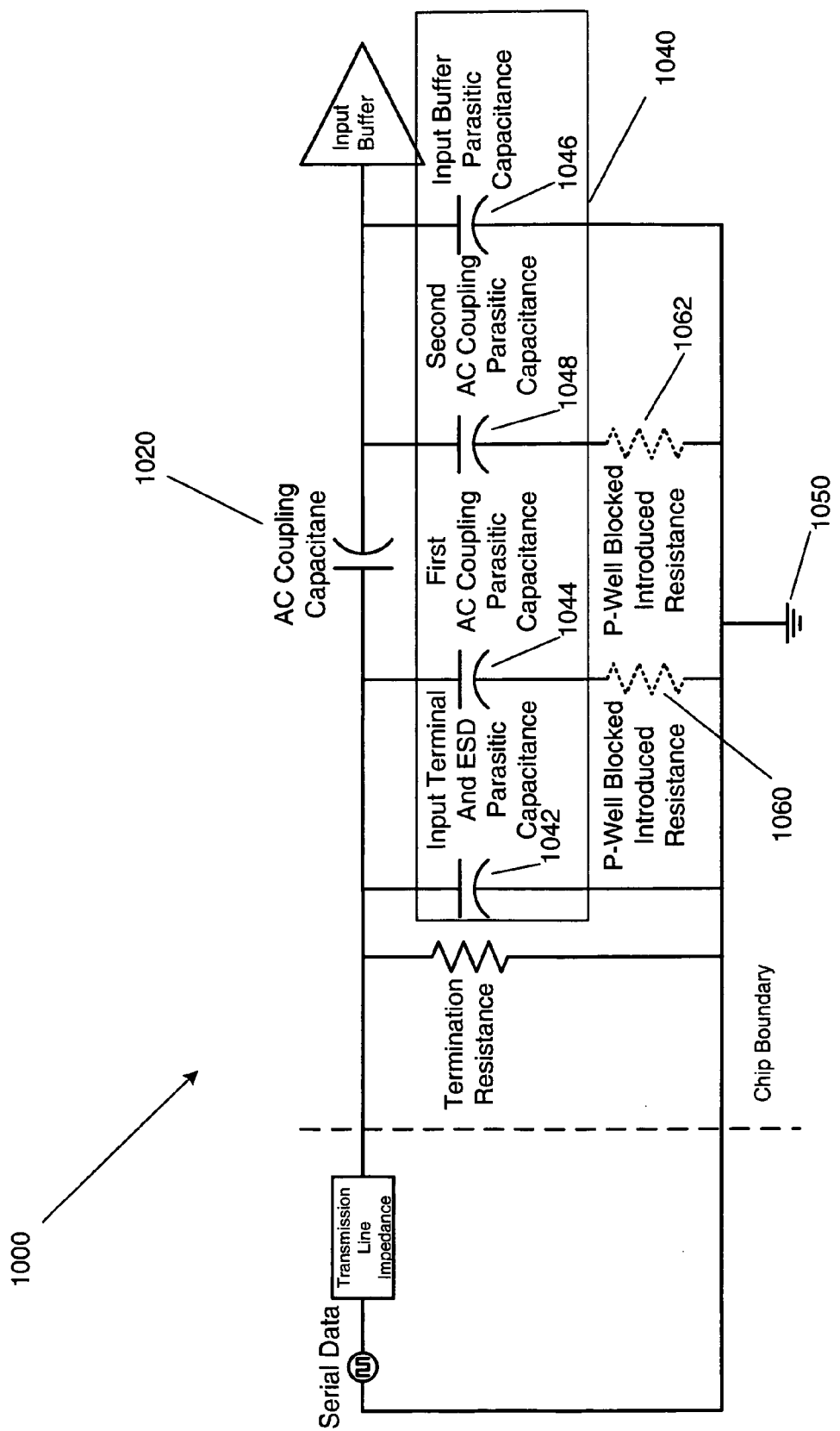
FIG. 10 illustrates an input channel model with component parasitic capacitances and P-well blocked resistance according to an embodiment of the present invention.

FIG. 10 illustrates an input channel model 1000 with component parasitic capacitances and P-well blocked resistance according to an embodiment of the present invention. In FIG. 10, parasitic capacitances 1040 are shown and include the input terminal and ESD parasitic capacitance 1042, AC coupling parasitic capacitances 1044, 1048 at either end of the AC coupling capacitor 1020 and input buffer parasitic capacitance 1046. However, resistances 1060, 1062 provided by the P-well blocked layer are disposed between the AC coupling parasitic capacitances 1044, 1048 at either end of the AC coupling capacitor 1020 and ground 1050 to partially disconnect plate capacitance of the AC coupling capacitor 1020 from the ground terminal 1050. For an input channel as shown in FIG. 10, an improvement may be achieved based on geometrical estimates of the implementation shape. However, the improvement could vary depending on capacitance size and area used for the blocked P-Well.

Figure 11:
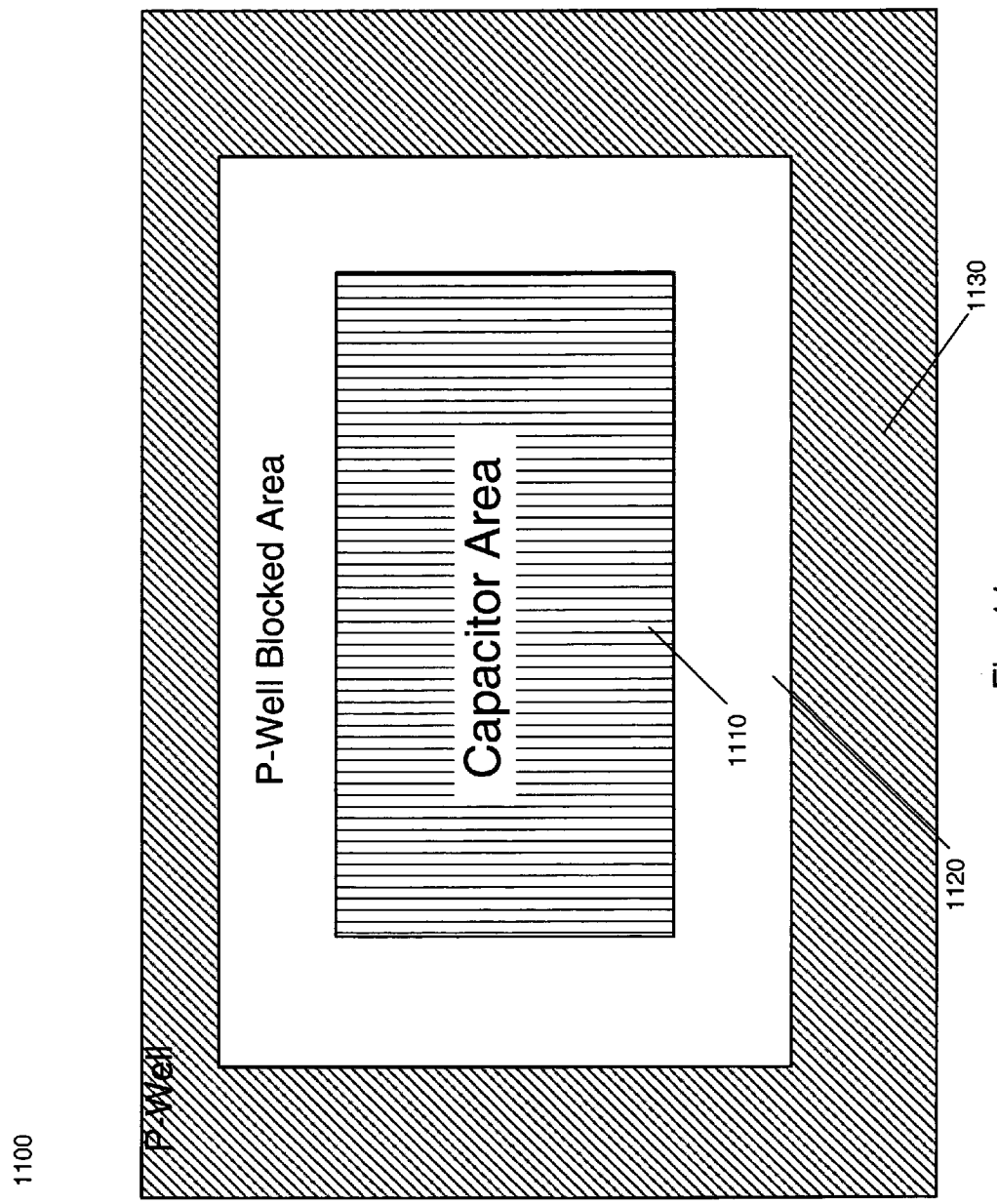
FIG. 11 is a top view of a P-well blocked capacitor according to an embodiment of the present invention.

FIG. 11 is a top view of a P-well blocked capacitor 1100 according to an embodiment of the present invention. In FIG. 11, the capacitor area 1110 is disposed directly over the P-well blocked area 1120. In FIG. 11, a portion of the P-well blocked area 1120 extends not only underneath the capacitor area 1110 but also beyond the capacitor area 1110. The P-well blocked area 1120 is surrounded by the P-well layer 1130. The estimation of the introduced ground resistance can be performed by various numerical methods that take into account the specific shape of the laid out capacitor and that of the PWB layer 1120 underneath. For such a resistance to be properly modeled in circuit simulation, a distributed capacitive resistive model may be used.

Figure 12:
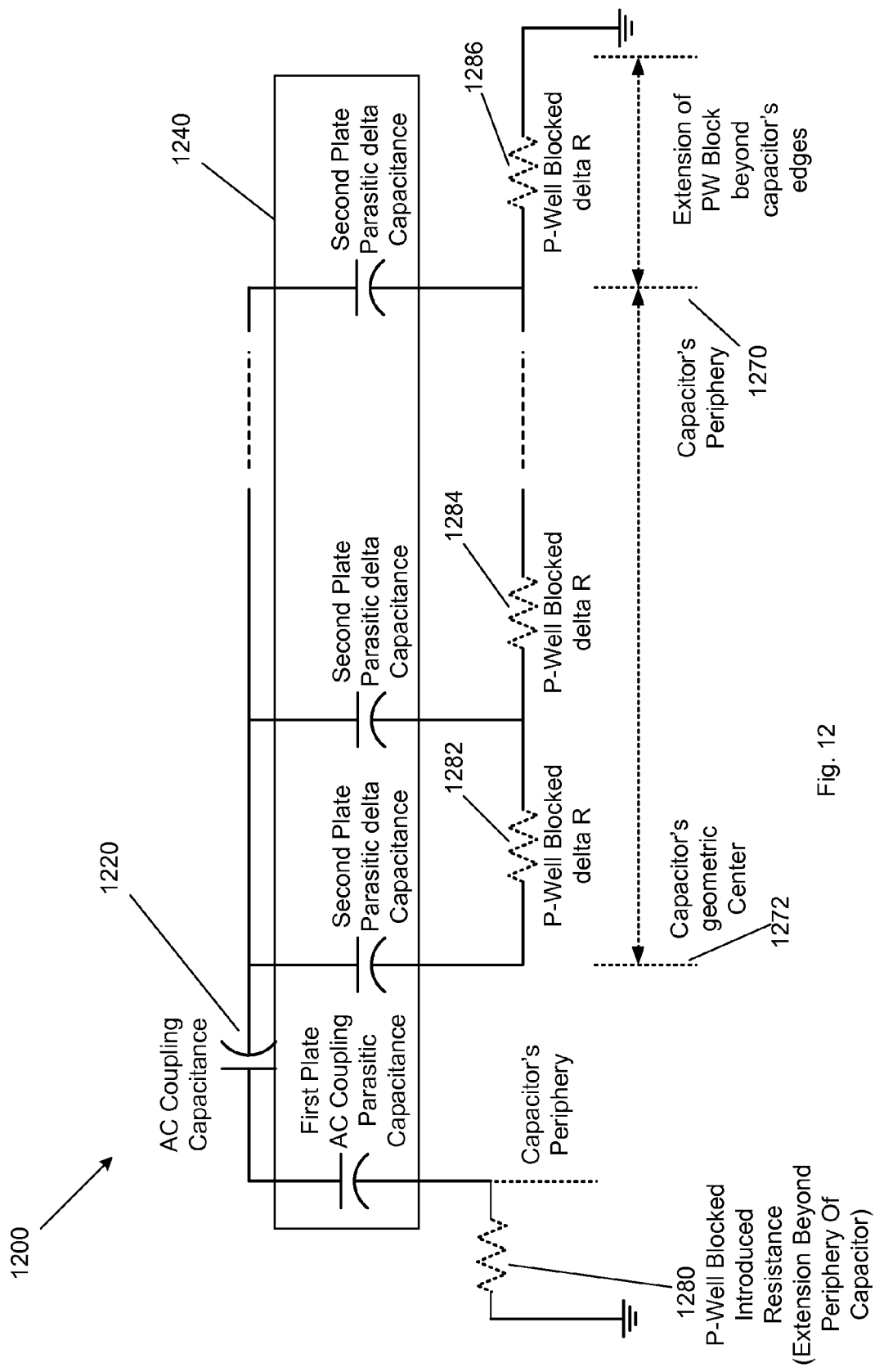
FIG. 12 is a distributed model for the P-well blocked resistance to ground underneath the bottom capacitor plate according to an embodiment of the present invention.

FIG. 12 is a distributed model 1200 for the P-well blocked resistance to ground underneath the second capacitor plate according to an embodiment of the present invention. The distributed model 1200 demonstrates a simplified resistance estimation process that is based upon the calculation of the resistance of the P-well blocked layer extending beyond the capacitor periphery 1270. In FIG. 12, the AC coupling capacitor 1220 is shown. The parasitic capacitance 1240 is shown coupled to the AC coupling capacitor 1220 and P-well blocked introduced resistances 1280, 1282, 1284, 1286. The illustration of the P-well blocked introduced resistances 1282, 1284 is applicable to a finger capacitor whereas P-well blocked introduced resistance 1280 is applicable to a parallel plate capacitor. However, those skilled in the art will recognize that if the capacitor is a finger capacitor then the model will take the form illustrated by P-well blocked delta R 1282, 1284, 1286 on both sides of AC coupling capacitor 1220, and if the capacitor is a parallel capacitor then the model will take the form illustrated by P-well blocked introduced resistance 1280 on both sides of AC coupling capacitor 1220.

The highest series resistance is measured from the geometric center of the capacitor 1272 and decreases toward the capacitor periphery 1270 and beyond. However, the resistance of the P-well blocked layer 1286 extending beyond the capacitor periphery 1270 is easier to calculate. Thus, a minimum required resistance 1286 to ground can be calculated by identifying the capacitor periphery 1270 and extending the P-well blocked layer a predetermined distance to provide a desired P-well blocked delta R for the portion of the P-well blocked layer extending beyond the periphery of the AC coupling capacitor. The unaccounted distributed resistance underneath the capacitor 1282, 1284 comes as a bonus resistance that is added on top of the precisely calculated portion 1286.

While an AC coupling capacitor has been discussed with respect to the invention, those skilled in the art will recognize that the present invention is not meant to be limited to use with a capacitor. Rather, embodiments of the present invention may be used with other devices to prevent or minimize parasitic capacitance at an input of a data channel. Furthermore, those skilled in the art will recognize that the present invention, when implemented with a capacitor for reducing return loss, is not meant to be limited to any particular capacitor configuration, i.e., the capacitor may take the form of a finger capacitor, a parallel plate capacitor, etc.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A device, comprising:
a blocked portion;
wherein formation of a P-well is prevented in the blocked portion of a substrate of an integrated circuit;
a P-well formed around the blocked portion; and
wherein a resistivity of the blocked portion of the substrate is higher than a resistivity of the P-well;
wherein the resistivity of the blocked portion of the substrate is equal to a resistivity of the substrate;

an electronic device formed above the blocked portion, wherein the blocked portion includes a series resistance to substrate ground to reduce parasitic capacitance of the electronic device;

wherein the electronic device is a signal coupling capacitor, and the blocked portion includes a portion extending beyond a periphery of the signal coupling capacitor and a dimension of the portion is selected to provide a predetermined series resistance between a ground terminal at the substrate and the parasitic capacitance of the signal coupling capacitor.

2. The device of claim 1, wherein the signal coupling capacitor further comprises capacitor plates, wherein the capacitor plates are formed above the blocked portion.

3. The device of claim 2, wherein the blocked portion provides the predetermined series resistance underneath the capacitor plates to impede current flow from the capacitor plates to the ground terminal.

4. The device of claim 1, wherein the P-well and the blocked portion are formed over the substrate.

5. The low parasitic capacitance device of claim 2, wherein the blocked portion increases the resistance underneath the electronic device to impede current flow from the electronic device to a ground terminal; and wherein the parasitic capacitance includes respective parasitic capacitances for the capacitor plates, and the blocked portion provides the predetermined series resistance underneath the signal coupling capacitor to impede current flow from the capacitor plates through the respective parasitic capacitances to the ground terminal.

6. An input channel, comprising:
an input port;
a receiver;
a coupling device, disposed between the input port and the receiver, the coupling device conditioning an input signal from the input port for further processing by the receiver, the coupling device comprising:
  a blocked portion;
  wherein formation of a P-well is prevented in the blocked portion;
  a P-well formed around the blocked portion;
  wherein a resistivity of the blocked portion is higher than a resistivity of the P-well;
  wherein the resistivity of the blocked portion is 10 to 20 Ohm-cm; and
  an electronic device formed above the blocked portion, wherein the blocked portion includes a series resistance to substrate ground to reduce parasitic capacitance of the electronic device;
  wherein the blocked portion comprises a portion extending beyond a periphery of the electronic device and a dimension of the portion is selected to provide a predetermined series resistance between a ground terminal at the substrate and a parasitic capacitance of the electronic device.

7. The input channel of claim 6, wherein the electronic device further comprises capacitor plates, wherein the capacitor plates are formed above the blocked portion.

8. The input channel of claim 7, wherein the blocked portion provides the predetermined series resistance underneath the plates to impede current flow from the plates to the ground terminal.

9. The input channel of claim 6 further comprising the substrate of an integrated circuit, the P-well and the blocked portion formed over the substrate.

10. The input channel of claim 7, wherein the blocked portion increases the resistance underneath the electronic device to impede current flow from the electronic device to a ground terminal;

wherein the parasitic capacitance includes respective parasitic capacitances for the plates, and the blocked portion provides the predetermined series resistance underneath the electronic device to impede current flow from the capacitor plates through the respective parasitic capacitances to the ground terminal.

11. The device of claim 2, wherein the dimension of the portion of the blocked portion extending beyond the periphery of the signal coupling capacitor is an extent of the blocked portion beyond the periphery of the signal coupling capacitor, and the extent is selected to provide the predetermined series resistance within the blocked portion.

12. The device of claim 11, wherein the capacitor plates are metal plates, and the signal coupling capacitor does not include any plate other than the metal plates.

13. The input channel of claim 7, wherein the dimension of the portion of the blocked portion extending beyond the periphery of the electronic device is an extent of the blocked portion beyond the periphery of the electronic device, and the extent is selected to provide the predetermined series resistance within the blocked portion.

14. The input channel of claim 13, wherein the electronic device does not include any plate other than the capacitor plates and the capacitor plates are metal plates.

* * * * *

UNITED STATES PATENT AND TRADEMARK OFFICE
CERTIFICATE OF CORRECTION

PATENT NO. : 7,619,298 B1
APPLICATION NO. : 11/095812
DATED : November 17, 2009
INVENTOR(S) : Abughazaleh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 424 days.

Signed and Sealed this

Twenty-sixth Day of October, 2010

David J. Kappos
*Director of the United States Patent and Trademark Office*